(12) United States Patent
Shahi

(10) Patent No.: US 11,626,863 B1
(45) Date of Patent: Apr. 11, 2023

(54) HIGH SPEED DIFFERENTIAL INPUT SINGLE PHASE CLOCK FLIP-FLOP

(71) Applicant: Cadence Design Systems, Inc., San Jose, CA (US)

(72) Inventor: Rajendra Singh Shahi, Uttarakhand (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/373,890

(22) Filed: Jul. 13, 2021

(51) Int. Cl.
*H03K 3/037* (2006.01)
*G06F 1/06* (2006.01)

(52) U.S. Cl.
CPC .............. *H03K 3/0372* (2013.01); *G06F 1/06* (2013.01)

(58) Field of Classification Search
CPC ...... H03K 3/027; H03K 3/037; H03K 3/0372; H03K 3/0375; H03K 3/353; H03K 3/356; H03K 3/356008; H03K 3/356086; H03K 3/356104; H03K 3/356147; H03K 3/356182; H03K 3/3562; H03K 3/35625; G06F 1/06
See application file for complete search history.

(56) References Cited

U.S. PATENT DOCUMENTS

| 7,092,474 | B2 * | 8/2006 | Cao ......................... H04L 7/033 375/373 |
| 9,490,782 | B2 * | 11/2016 | Sharma ............ H03K 3/356156 |
| 2015/0123722 | A1 * | 5/2015 | Sharma .............. H03K 3/35625 327/203 |

FOREIGN PATENT DOCUMENTS

JP 2000188525 A * 7/2000 ............. H03K 3/037

* cited by examiner

*Primary Examiner* — Long Nguyen
(74) *Attorney, Agent, or Firm* — Mark H. Whittenberger; Holland & Knight LLP

(57) ABSTRACT

The present disclosure relates to a high speed, differential input, single phase clock circuit. The circuit may include a cross-coupled PMOS connected with a cross-coupled NMOS via a pass gate. The circuit may further include a single-phase clock in communication with the cross-coupled PMOS and the cross-coupled NMOS. The circuit may also include a master and a slave each having an output node that charges and discharges to $V_{DD}$ or ground respectively, wherein there is no direct feedback from an output of the circuit to an input the circuit and there is no precharged state in the circuit.

10 Claims, 20 Drawing Sheets

| Parameter | TSPC Flop As in [1] | MTSPC as in [1] | Proposed Flop |
|---|---|---|---|
| Setup Time | 70.13pS | 64.14pS | 22.82pS |
| Hold Time | 0 | 6pS | -1.6pS |
| Clock to Q Delay | 143.6pS | 122ps | 39.02pS |
| Power Dissipation | 75.43uW | 21.83uW | 47.91uW |
| Delay*Power (FOM) | $16121.65*10^{-18}$ J | $4063.43*10^{-18}$ J | $2958.9*10^{-18}$ J |
| Maximum Operating Frequency | About 2 GHz | About 2GHz | About 9GHz |
| Transistor used with Set Reset Pin | 15 | 13 | 12 with input inverter and Set Reset |

HIGH SPEED DIFFERENTIAL INPUT SINGLE PHASE CLOCK FLIP-FLOP

FIELD OF THE INVENTION

Embodiments of the present disclosure relate to electronic circuit design and, more particularly, to a high speed, single phase flip-flop.

BACKGROUND

Flip-flops are the basic building blocks of digital circuits and, to a large extent, determine the speed of a given circuit. The performance of flip-flops directly affects the overall performance of a digital circuit. Flip-flops are either static or dynamic. A static flip-flop is typically based around two inverter-based latches that have a large impact on area and delay. However, flip-flops based on dynamic logic have advantages in that they have a higher operating speed and reduced area density compared to static flip-flops. Most flip-flops require both a clock signal and its inversion which challenges clock tree synthesis.

SUMMARY

Accordingly, an embodiment of the present disclosure is directed to a circuit that may include a cross-coupled PMOS connected with a cross-coupled NMOS via a pass gate. The circuit may further include a single-phase clock in communication with the cross-coupled PMOS and the cross-coupled NMOS. The circuit may also include a master and a slave each having an output node that charges and discharges to $V_{DD}$ or ground respectively, wherein there is no direct feedback from an output of the circuit to an input the circuit and there is no precharged state in the circuit.

One or more of the following features may be included. In some embodiments, the circuit may include an inverter connected to an output of the circuit that increases a driving strength of the circuit. The circuit may be semistatic and may include both static and dynamic properties. The circuit may include differential inputs. The circuit may include a single NMOS or PMOS at a node as a set pin and/or a single NMOS or PMOS at a node as a reset pin. The circuit may be included within an oscillator or a counter. The circuit may operate at a frequency range of 0-10 GHz. The pass gate may be a transmission gate. In some embodiments, differential outputs may be generated simultaneously.

In another embodiment of the present disclosure a method is provided. The method may include connecting a cross-coupled PMOS with a cross-coupled NMOS via a pass gate. The method may further include controlling the cross-coupled PMOS, the cross-coupled NMOS, and the pass gate using a single-phase clock. The method may also include charging and discharging, a master and a slave each having an output node, to $V_{DD}$ or ground respectively, wherein there is no direct feedback from an output of the circuit to an input the circuit and there is no precharged state in the circuit.

One or more of the following features may be included. In some embodiments, the method may include increasing a driving strength of the circuit using an inverter connected to an output of the circuit. The circuit may be semistatic and includes both static and dynamic properties. The method may include providing differential inputs to the circuit. The method may further include adding a single NMOS or PMOS at a node as a set pin and/or adding a single NMOS or PMOS at a node as a reset pin. The method may include providing the circuit within an oscillator or a counter. The method may further include operating the circuit at a frequency range of 0-10 GHz. In some embodiments, the pass gate may be a transmission gate. The method may also include simultaneously generating differential outputs.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 19 is a table showing a comparison between the proposed circuit of the present disclosure and existing technologies.

DETAILED DESCRIPTION

Figure 1:
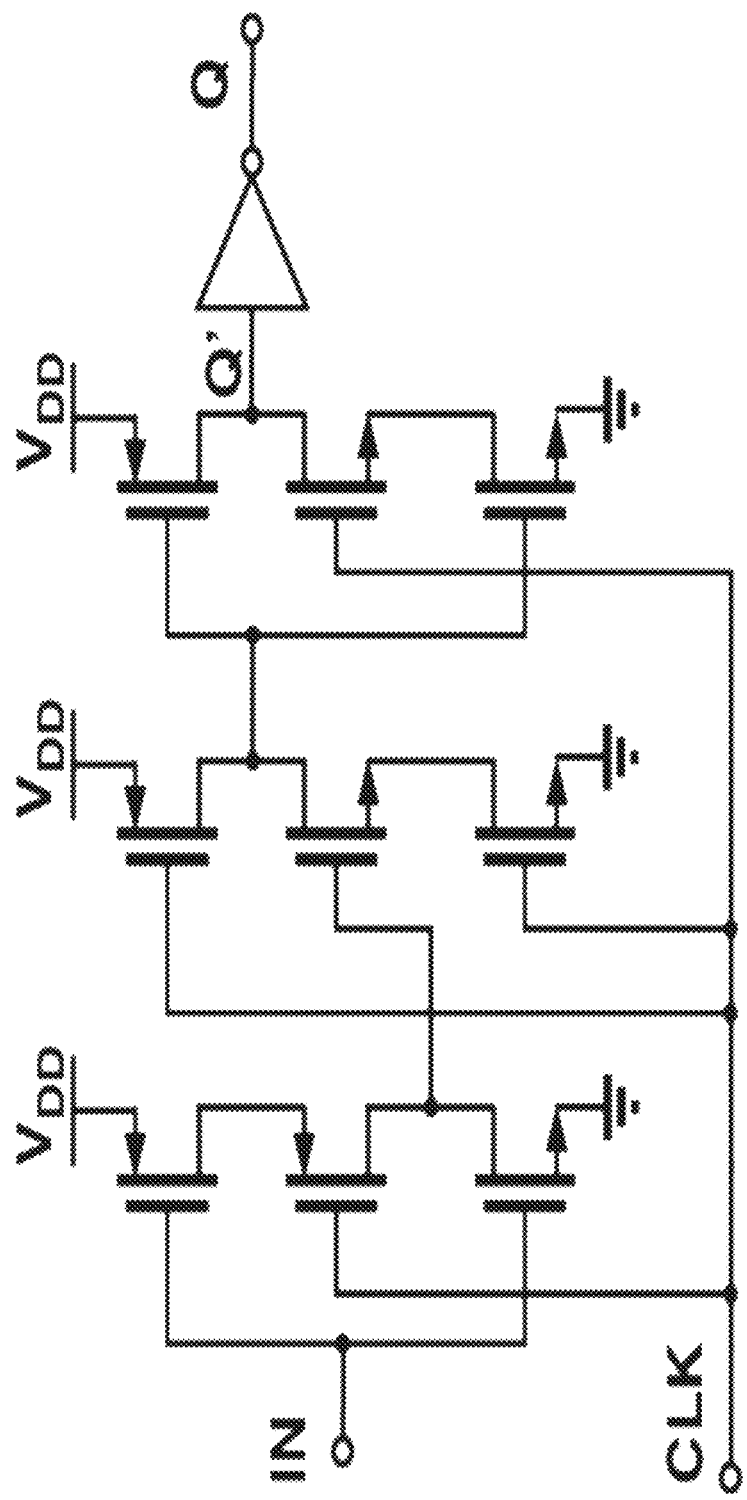
FIG. 1 is a diagram showing an example of a true single phase clock flip-flop.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity Like reference numerals in the drawings denote like elements.

In complex chips one general issue is related to the clock distribution. Long interconnects and heavy capacitive loading cause both slow transitions and skew. It is difficult to distribute multiple, high-speed clock phases. Dynamic logic affords simpler and faster circuits that also occupy less area, for example, "clocked CMOS" (C2MOS) logic replaced more complex latches with a four-transistor implementation. This approach, however, requires two non-overlapping clock phases so as to avoid transparency during (slow) clock transitions. Thus, clock generation and distribution have to deal with not only skews but the loss of timing due to non-overlapping intervals, which makes single-phase clocking more attractive.

Referring now to FIG. 1, an example of a true single phase clock (TSPC) flip-flop is provided. TSPC flip-flops are a widely used type of single phase clock flop. Similar to other dynamic logic families, TSPC circuits fail at sufficiently low clock frequencies. Transistor leakage arising from sub-threshold conduction and source, drain junctions corrupt the stored states if the clock period is excessively long. This issue typically becomes more serious at high temperatures. These effects arise at clock rates below 100 MHz. The use of a single clock phase can create a race condition, thereby producing glitches at some nodes in TSPC circuits.

Figure 2:
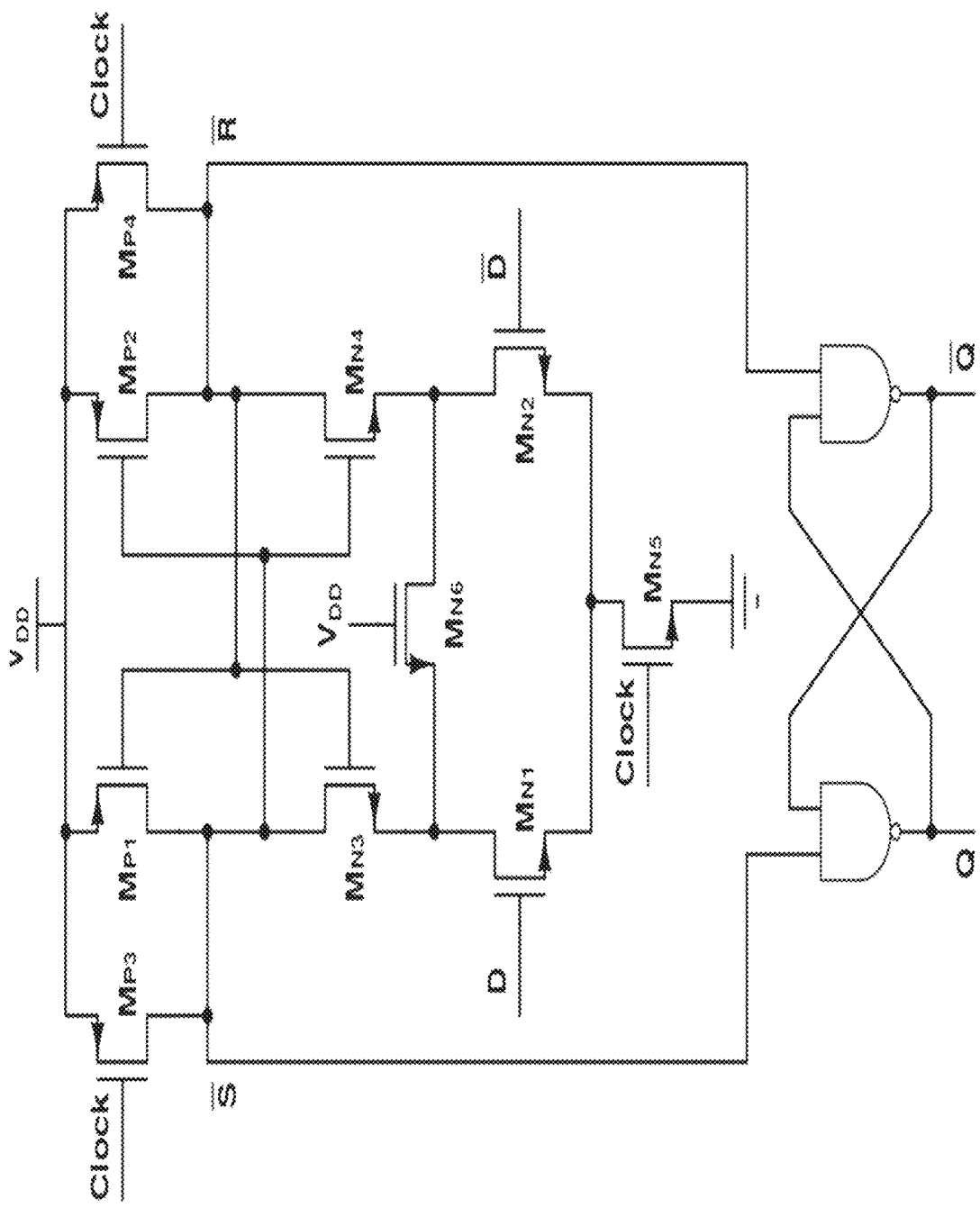
FIG. 2 is a diagram showing an example of a differential input flip-flop.
Figure 3:
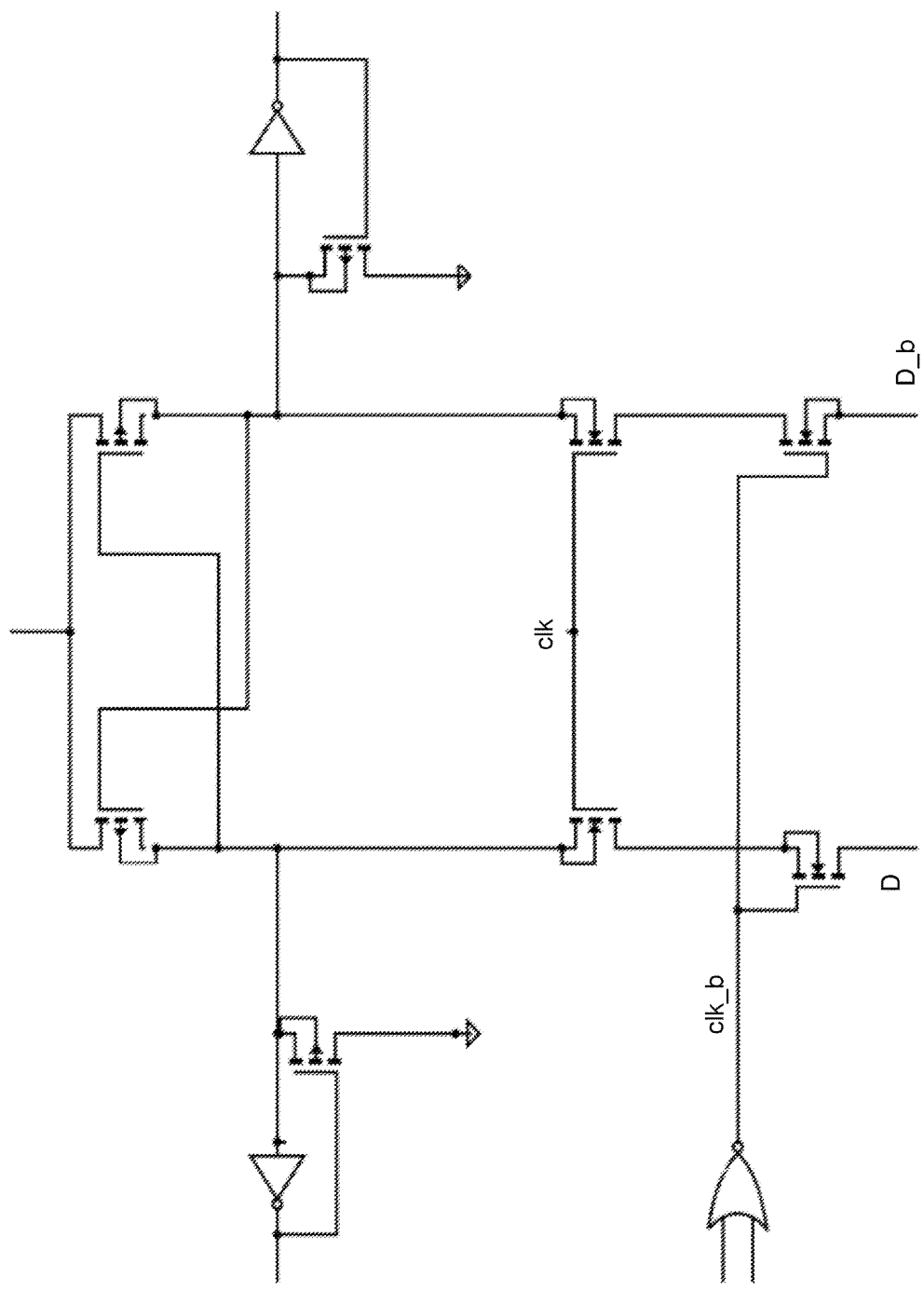
FIG. 3 is a diagram showing an example of a differential input flip-flop.

Referring now to FIGS. 2-3, examples of differential input flip-flops are provided. FIG. 2 shows a differential input flip-flop and a sense amplifier. FIG. 3 shows a static differential energy recovery (SDER) flip-flop.

Figure 4:
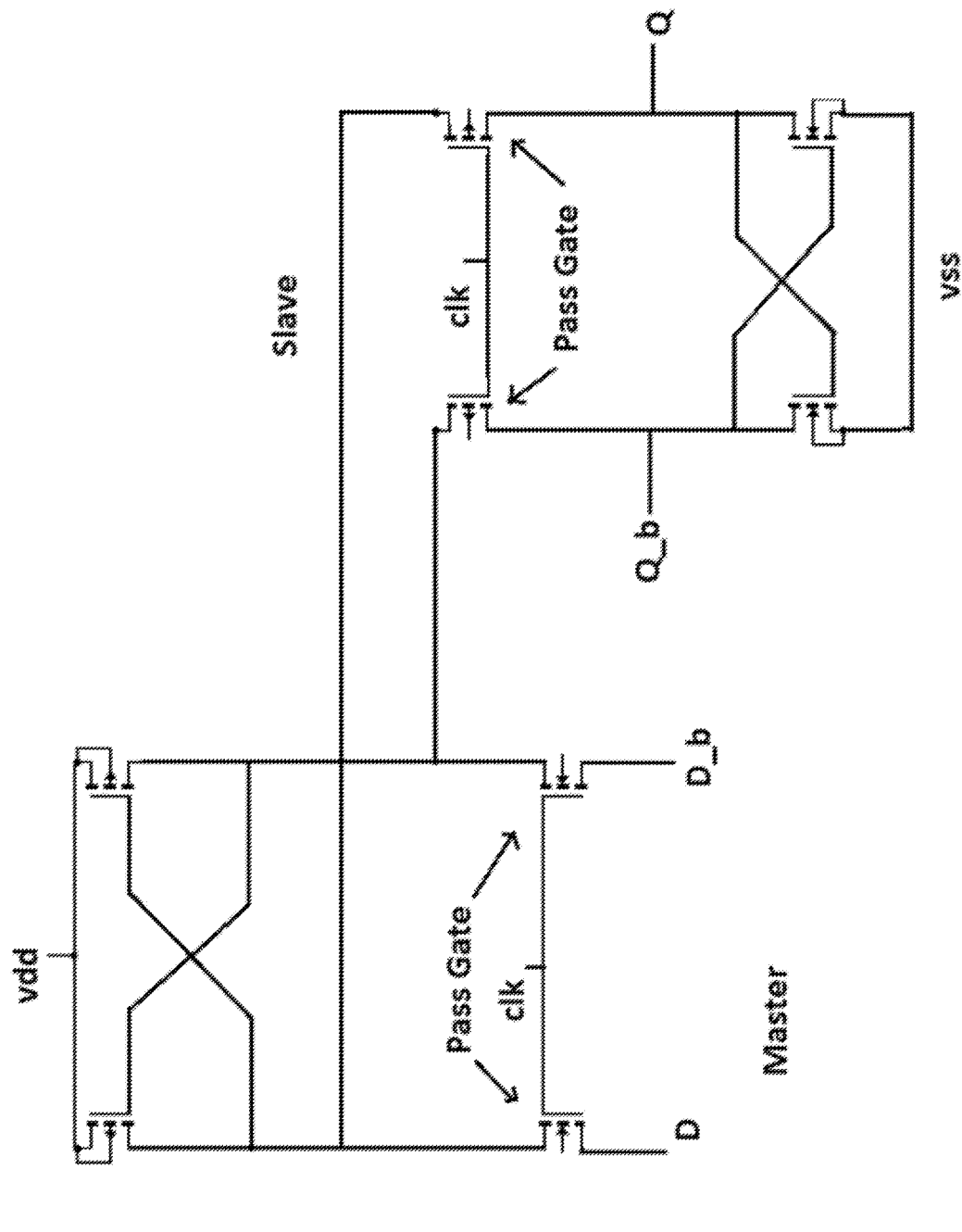
FIG. 4 is a diagram showing an example of a single phase clock flip-flop according to an embodiment of the present disclosure.

Referring now to FIG. 4, an embodiment of showing an embodiment consistent with the present disclosure is provided. The circuit may include a cross-coupled PMOS connected with a cross-coupled NMOS via a pass gate. The circuit may further include a single-phase clock in communication with the cross-coupled PMOS and the cross-coupled NMOS. The circuit may also include a master and a slave each having an output node that charges and discharges to VDD or ground respectively, wherein there is no direct feedback from an output of the circuit to an input the circuit and there is no precharged state in the circuit.

In contrast with the TSPC flip-flop discussed above, the circuits described herein provide a semi-static flip-flop that may include two cross-coupled MOS instead of the cross-coupled inverters present with static flip-flops. As shown in FIG. 4, circuit 400 does not have any direct feedback from its output to its input, as such the circuit is not fully static. However, there may be some feedback mechanism internally.

As used herein the term "static" may refer to a situation where the states are changed/saved due to various feedback such as a cross-coupled inverter wherein the output of one is connected to input of another. As such, the outputs of the inverters may remain in zero or 1. The term "dynamic" may refer to a situation where the output is zero or one due to the charging or discharging of a capacitor at the output node. Embodiments of the present disclosure may utilize a "semi-static" or "semi-dynamic" circuit as the outputs may charge to $V_{DD}$ or Ground as in a dynamic flip-flop, however, there may be feedback from one output of one MOSFET to an input of another MOSFET where they are cross-coupled.

In some embodiments, there may not be any pre-charged state present in contrast with the TSPC flip-flop discussed above. The output nodes of the master and slave charge and discharge to $V_{DD}$ or ground, respectively. In some embodiments, the master is an NMOS as pass gate with a cross-coupled PMOS and the slave is a PMOS as pass gate with a cross-coupled NMOS.

Figure 5:
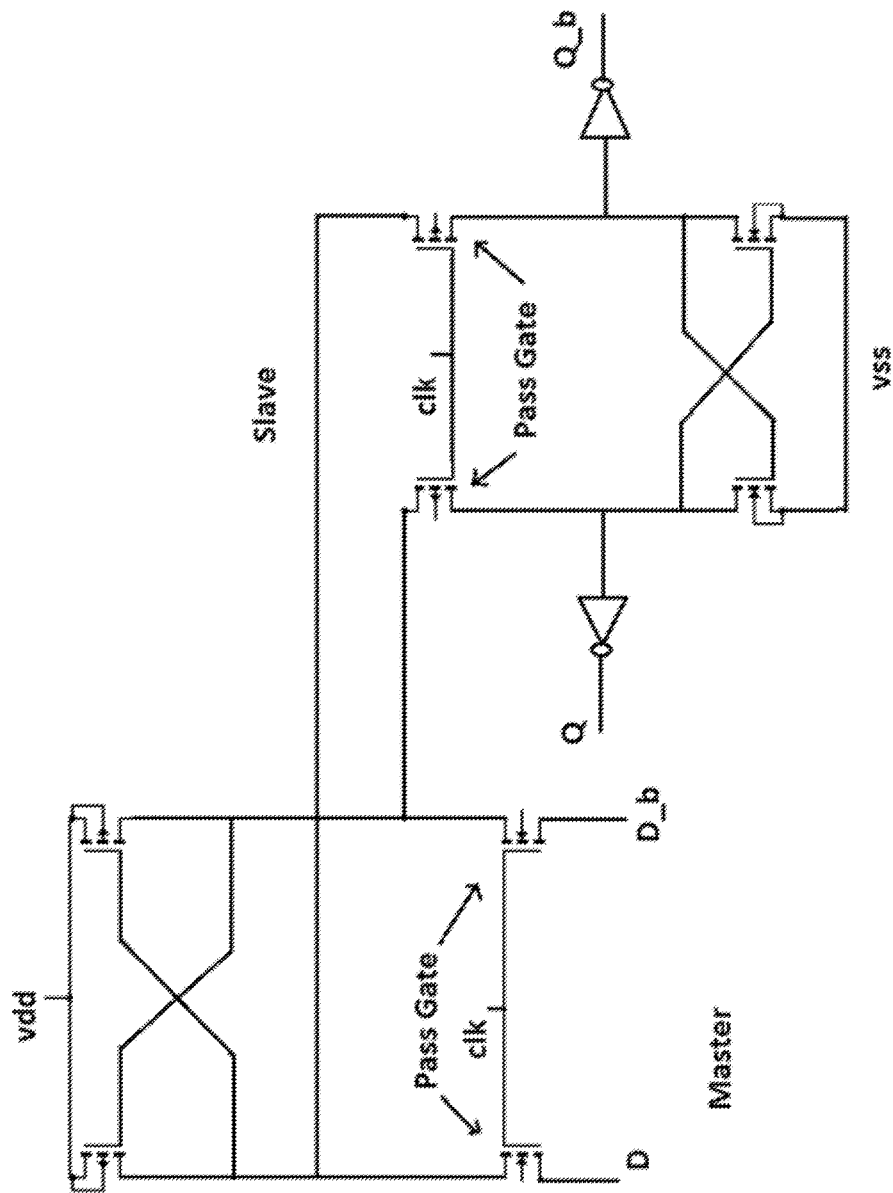
FIG. 5 is a diagram showing an example of a single phase clock flip-flop according to an embodiment of the present disclosure.

Referring now to FIG. 5, another embodiment of a circuit 500 consistent with embodiments of the present disclosure is provided. In this example, a single phase clock flip-flop is provided with an inverter located at the output of the circuit. In operation, the cross-coupled MOS eliminates the threshold effect of NMOS as a pass gate and PMOS as a pass gate. It should be noted that as a result of this design, no race condition occurs because there is no direct feedback from output to input.

Figure 6:
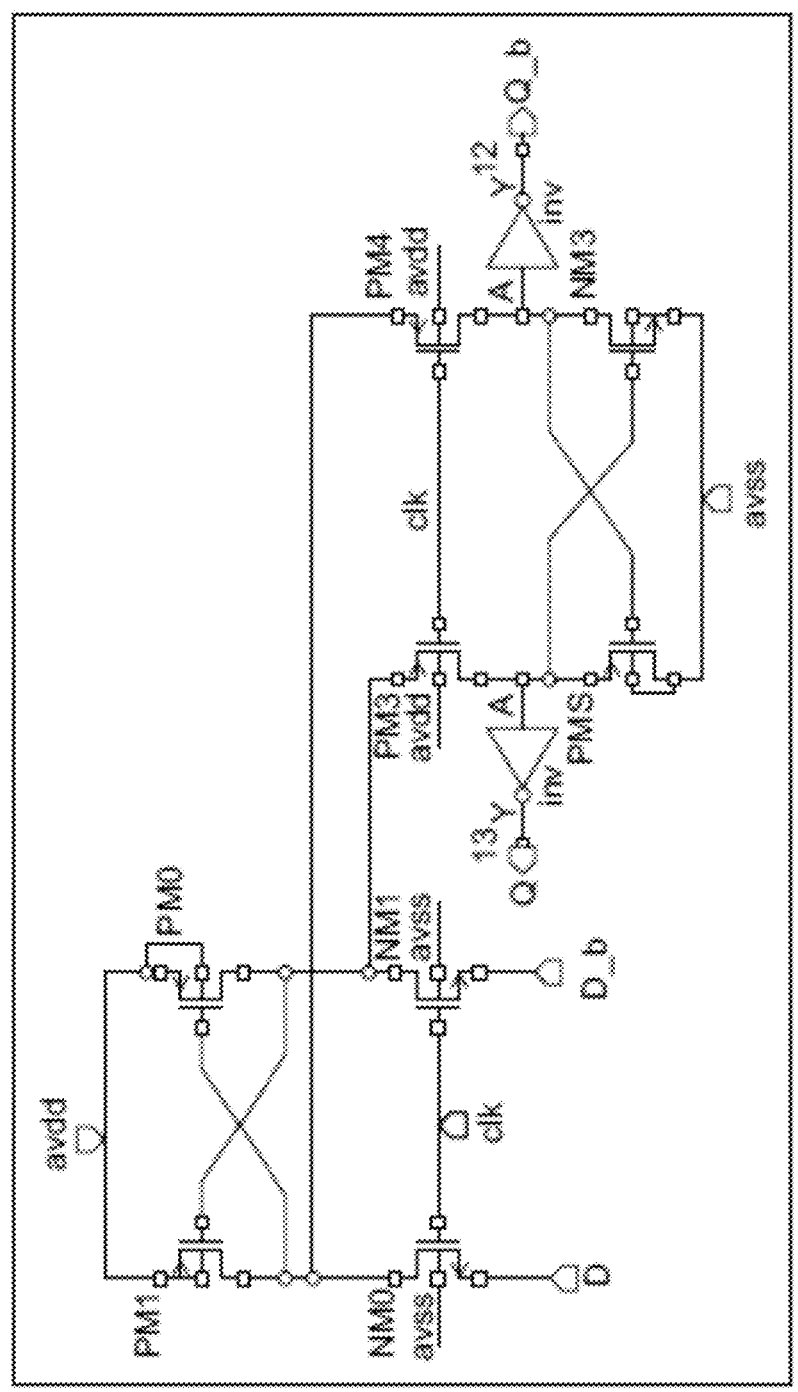
FIG. 6 is a schematic showing an example of a single phase clock flip-flop according to an embodiment of the present disclosure.
Figure 7:
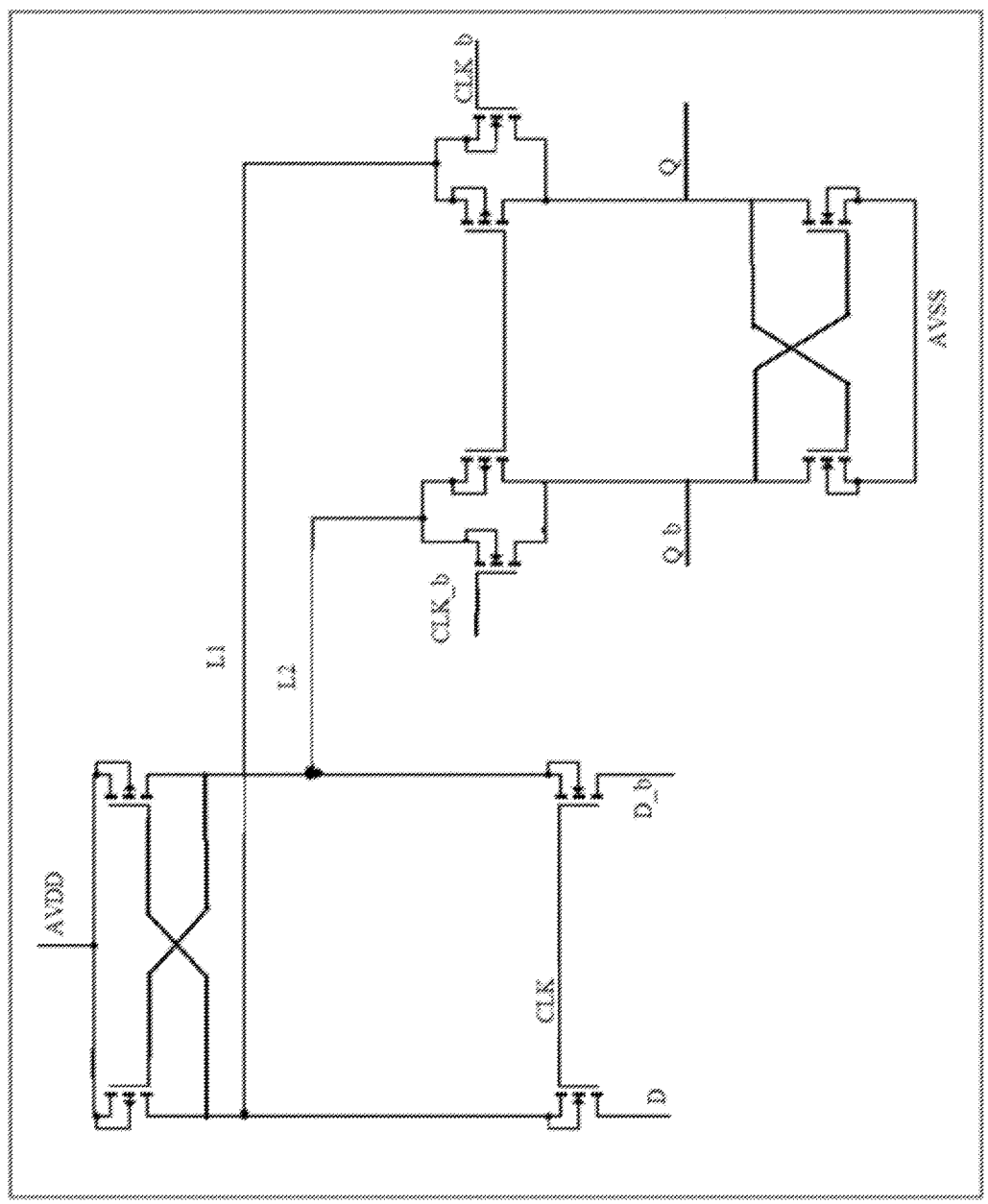
FIG. 7 is a schematic showing an example enhancement of a single phase clock flip-flop into a two-phase according to an embodiment of the present disclosure.
Figure 8:
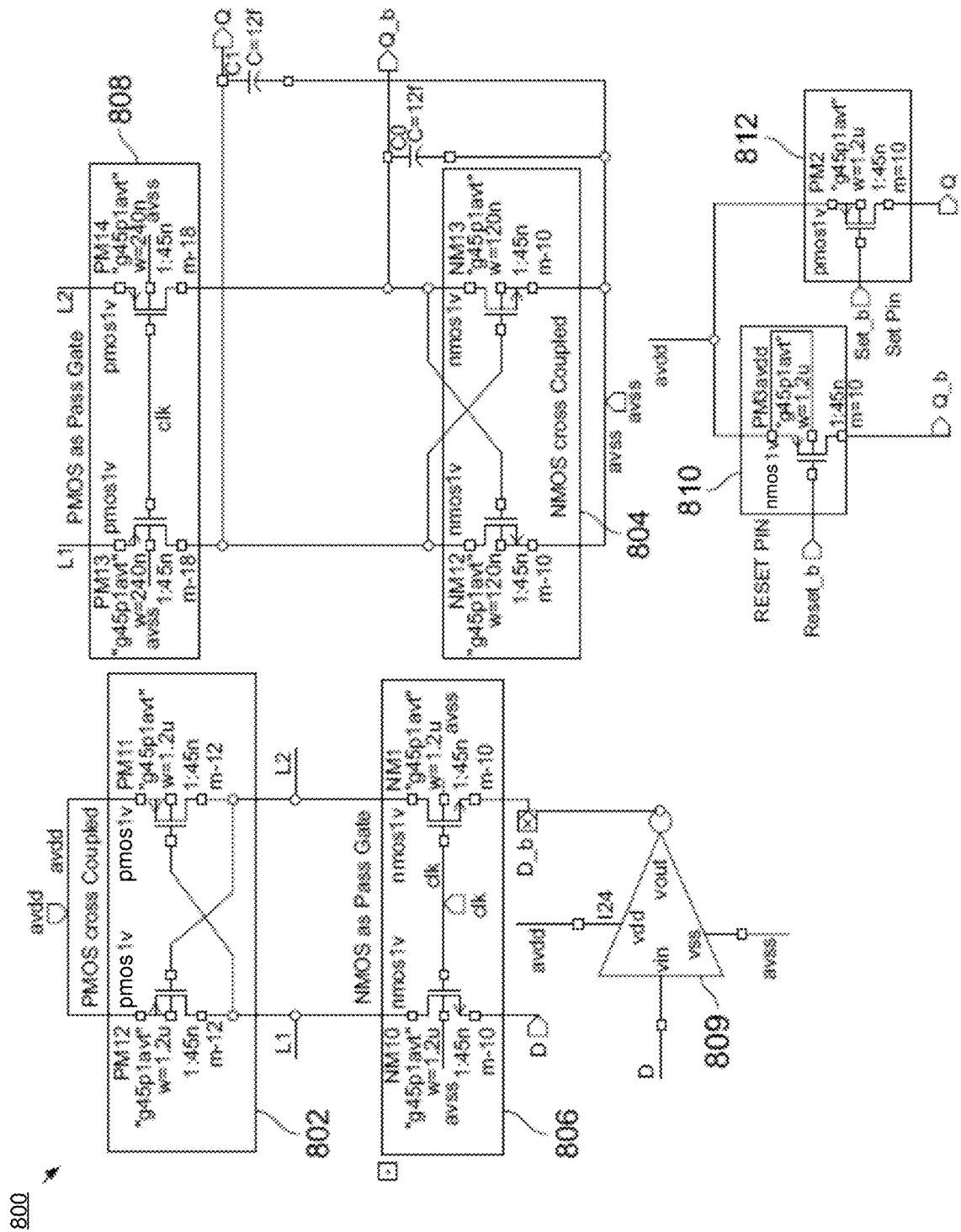
FIG. 8 is a schematic showing an example of a single phase clock flip-flop according to an embodiment of the present disclosure.

Referring also to FIGS. 6-8, a number of schematics 600, 700, 800 consistent with embodiments of the present disclosure are provided. In the example circuit shown in FIG. 7, a proposed flip-flop 700 is provided including a transmission gate. Here, the PMOS as a pass gate may be replaced with the transmission gate. In operation, the use of the transmission gate may make it useful for a double-phase clock. Here, when the clock is high the NMOS as pass gate will be on. When the clock is low, both the transmission gate will be on and input D may be transmitted to output.

In these examples, there may be two cross coupled PMOS 802, two cross coupled NMOS 804 and four pass gates in this particular flip-flop circuit. The inputs of NMOS as pass gates 806 are clock, D and clock, D_b (where D_b is the D complement). The inputs of the PMOS as pass gates 808 are the clock and output of the master. In operation, when the clock is high, the NMOS as pass gate may sense the inputs. The sensed inputs may reach the drain of the cross coupled PMOS. This may turn on one PMOS and turn off the other. The cross coupled PMOS may retain the sensed input until the next positive clock. When the clock is 0 the PMOS as a pass gate will turn on. It may sense the output of the master and send it to the output. The cross-coupled NMOS 804 may hold it until the next negative clock edge. The cross-coupled MOS may eliminate the threshold effect of the used pass gates. When the source of one of NMOS as pass gate is 1 it will not pass the complete high to drain but the cross coupled PMOS above it will charge that node to VDD due to cross coupling. When source of PMOS as pass gate is zero it will not pass the complete low. But the drain of this pass gate will become complete low due to cross coupled NMOS below it.

In some embodiments, since the outputs are charging and discharging to VDD or ground respectively it makes the circuit dynamic. There are some static properties due to cross coupled MOS. Generally, flip-flops where there is no feedback mechanism or where an inverter is not cross-coupled are dynamic. Here, a high-speed flip-flop is provided with a reduced number of MOSFETs and without any cross-coupled inverters used to latch the state. As shown in FIGS. 6-8, some embodiments may use D and D_b input which are inverting but this may become a single input (D input only) by using an inverter in the second input(D_b).

In some embodiments, the circuit may include adding one NMOS or PMOS at one or more nodes as a set and reset pin 810, 812. These designs require the addition of only one NMOS and one PMOS to make the set and reset pin for the proposed flip flop as shown in the right portion of FIG. 8.

Figure 9:
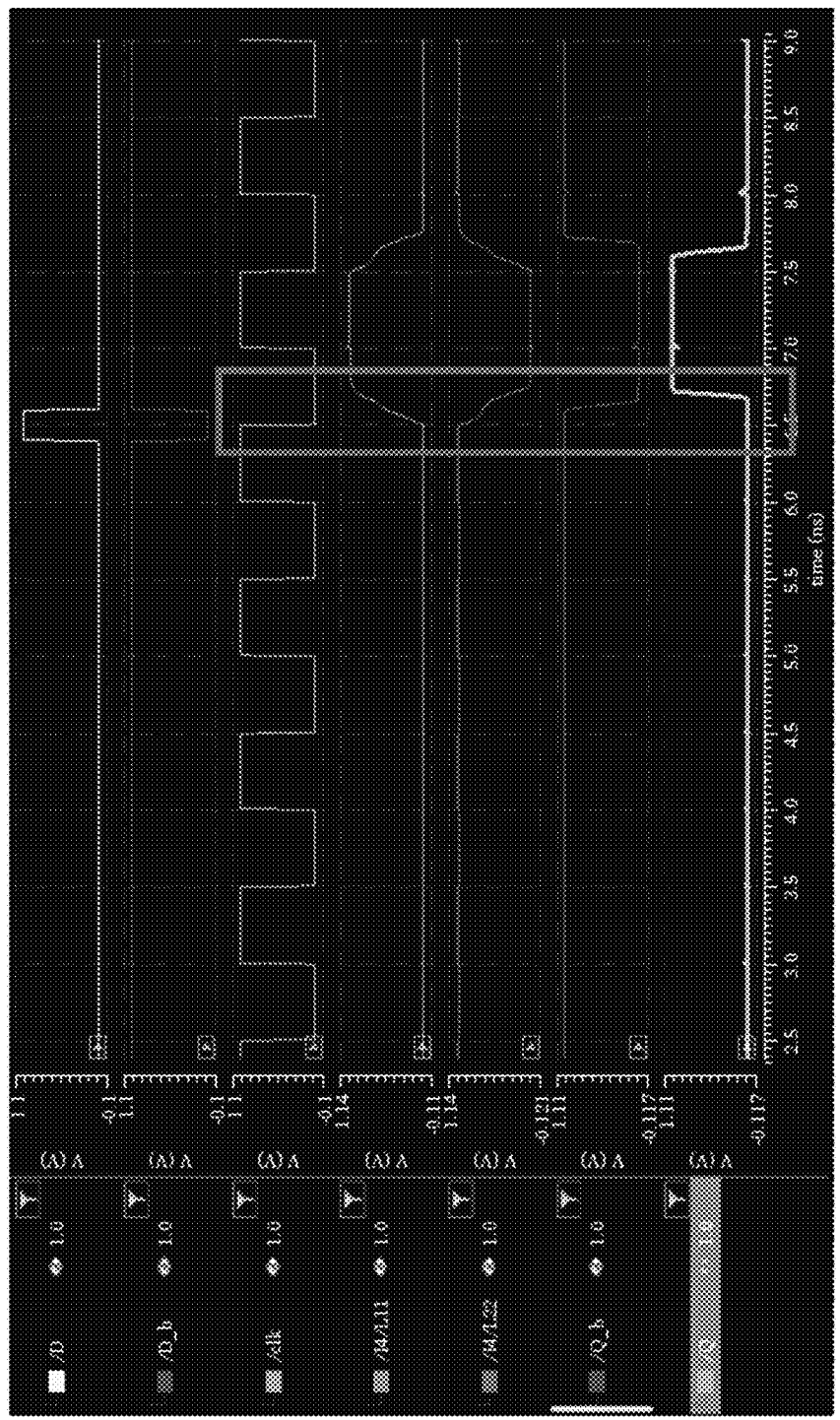
FIG. 9 is an input/output plot showing a clock with a high to low transition according to an embodiment of the present disclosure.

Referring now to FIG. 9, an input/output plot 900 showing a clock with a high to low transition is provided. In this particular example, a measurement is performed on gpdk045 using a 1 V power supply. Here, L11, L22 are the outputs at the input of applied inverters and Q, Q_b are the outputs after the inverter.

Figure 10:
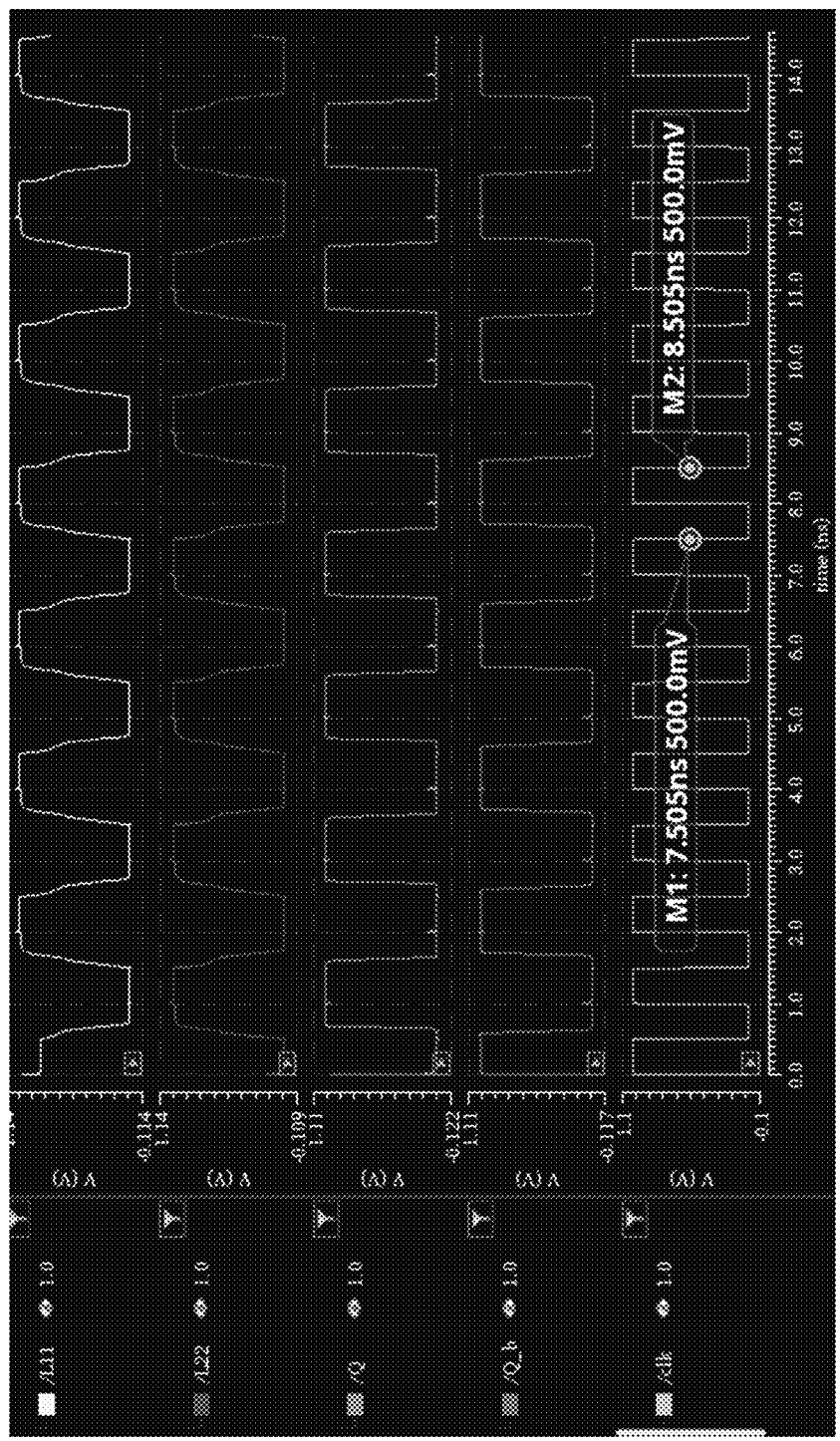
FIG. 10 is a graphical user interface showing example results of dynamic power dissipation of a divide by two counter of the single phase clock flip flop at 2 GHz with according to an embodiment of the present disclosure.

FIG. 10 shows a plot of a divide by 2 counter at 1 GHz.

Figure 11:
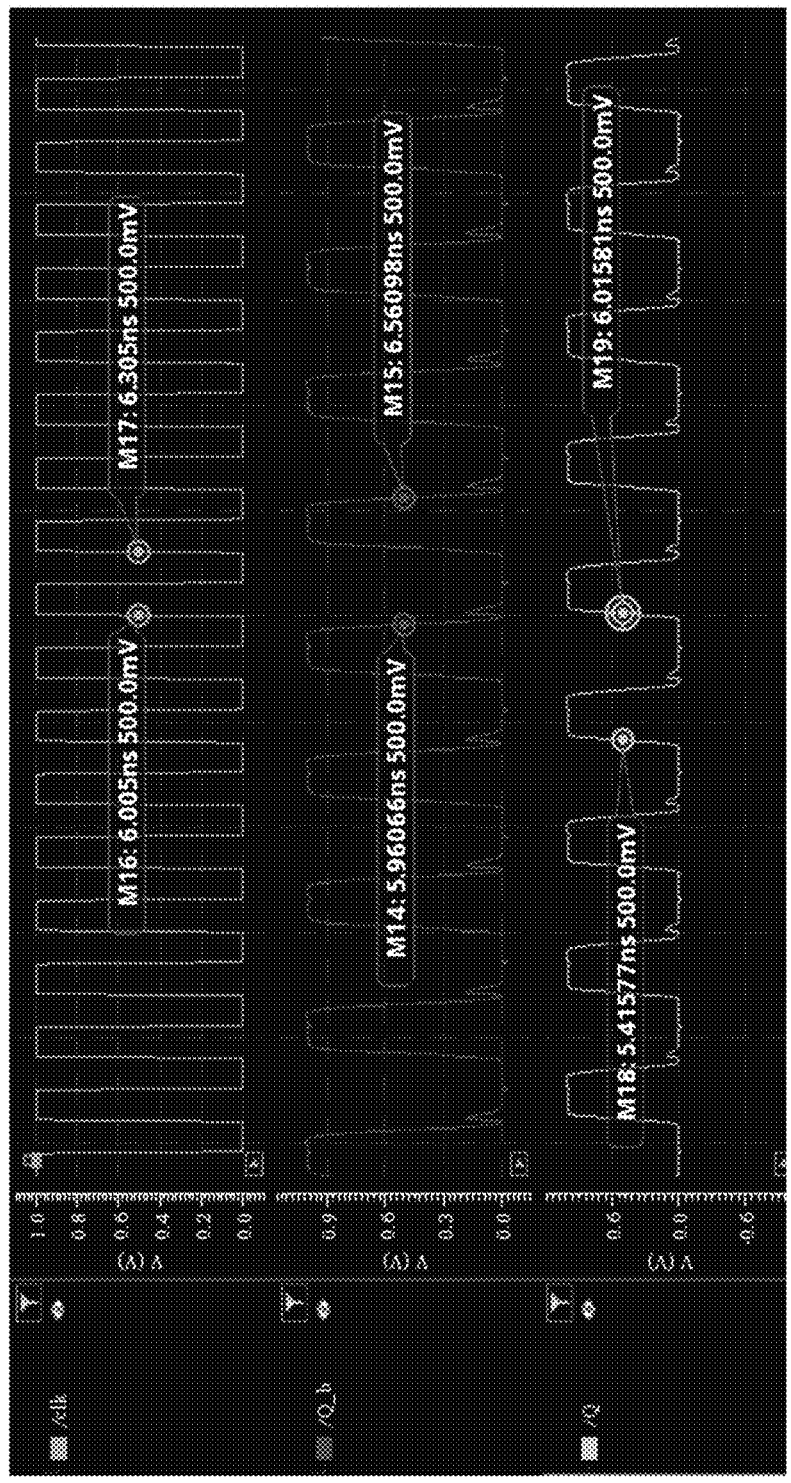
FIG. 11 is a graphical user interface showing example results of dynamic power dissipation of a divide by two counter of the single phase clock flip flop at 3.33 GHz according to an embodiment of the present disclosure.
Figure 12:
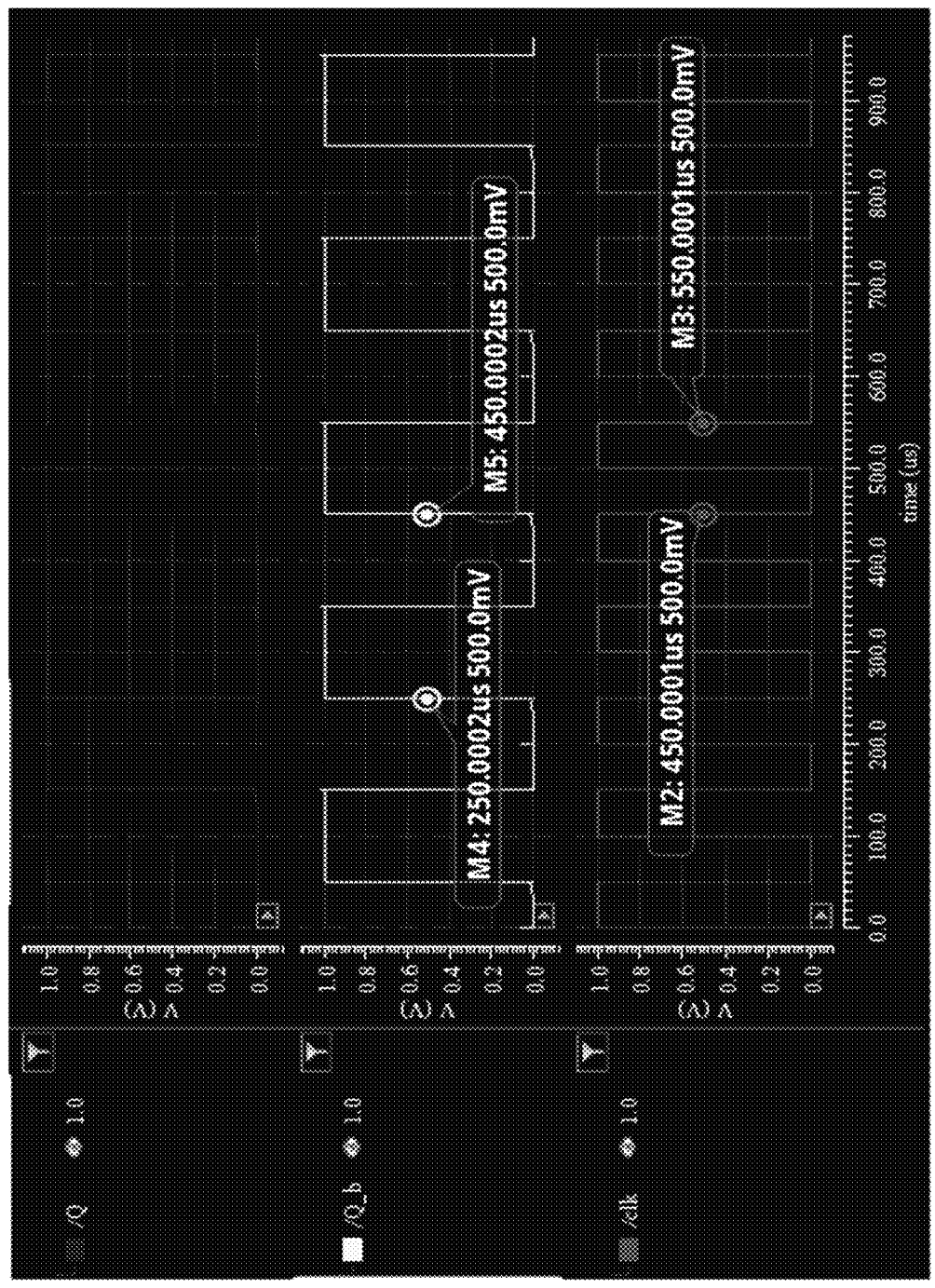
FIG. 12 is a graphical user interface showing example results of dynamic power dissipation of a divide by two counter of the single phase clock flip flop at 10 KHz according to an embodiment of the present disclosure.
Figure 13:
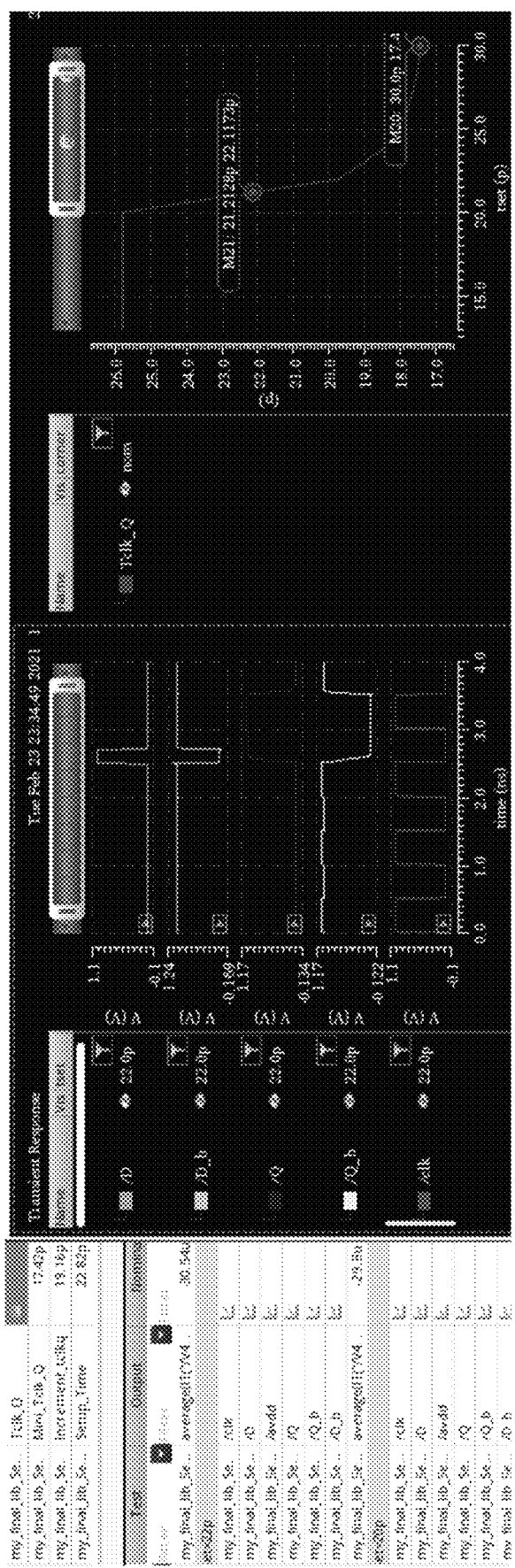
FIG. 13 is a graphical user interface showing example setup time of proposed circuit (low to high)
Figure 14:
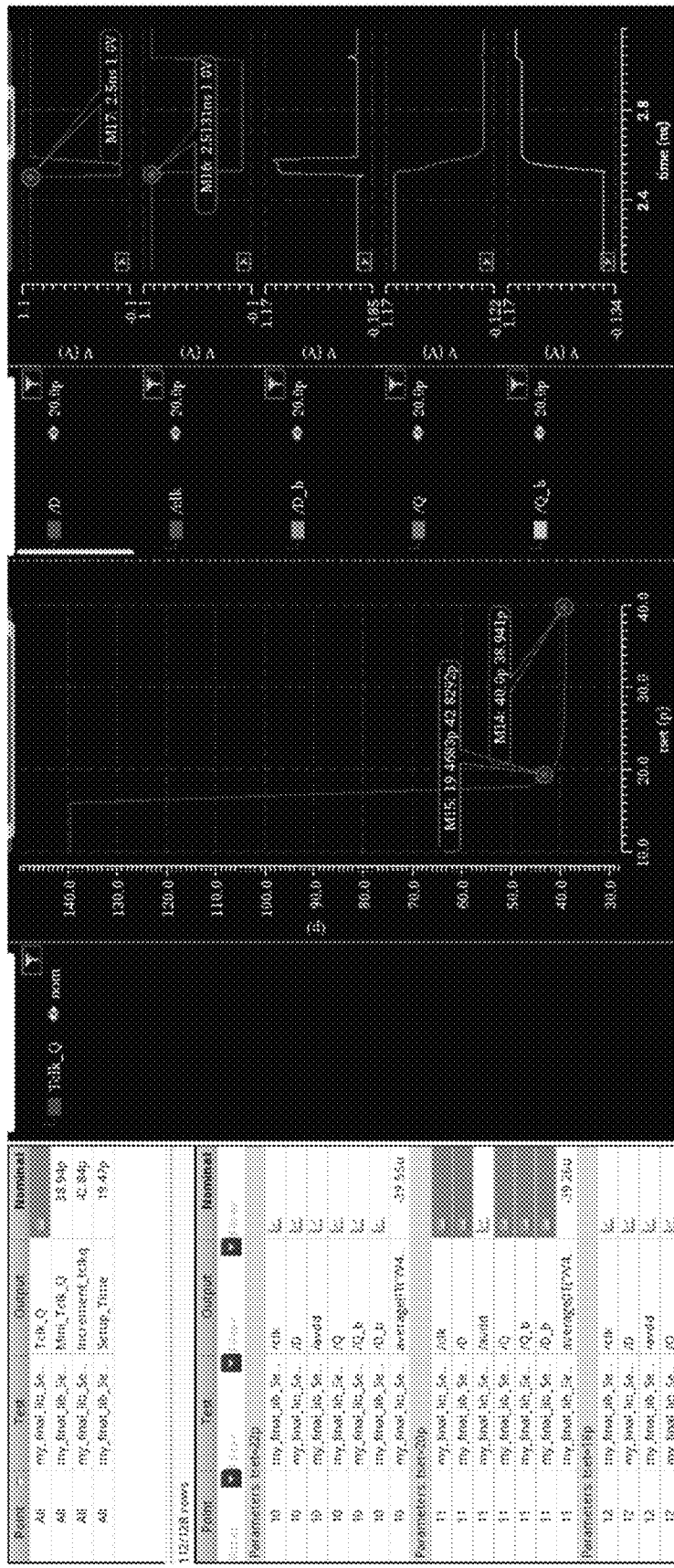
FIG. 14 is a graphical user interface showing example setup time of proposed circuit (high to low)

Referring now to FIG. 11, an example plot showing the flop is operating at 0.3 nS time period which is equal to 3.33 GHz. In this particular example, the dynamic power dissipation of the flip-flop is about 930 uW. The power dissipation is calculated in the divide by 2 counter with 2 GHz frequency and 10f F additional load. In this example, there are 90 low to high and high to low transitions of the clock. As there is no direct path from $V_{DD}$ to ground while clock is on or off hence static power dissipation is zero. The measurement may be performed on gpdk045 using a 1 V power supply. FIG. 12 shows the lower operating frequency range of the flop which is up to 10 KHz. Working as divide by 2 counter at 10 KHz. FIG. 13 shows an example for setup time and FIG. 14 shows an example with a divide by 2 counter at 10 KHz. The TSPC discussed above has an issue at lower frequencies due to charge sharing but embodiments included herein are fully operational at lower frequencies as well. Again, the measurement may be performed on gpdk045 using 1 V power supply.

FIG. 13 is a graphical user interface showing an example setup time of proposed circuit (low to high). This particular figure shows a change in clock to Q delay with tset time. Here, the setup time for low to high transition of input is 22.82 pS with clock to Q 17.42 pS. The setup time is taken as the tset time at which clock to Q delay increased by 10% of constant clock to Q delay.

FIG. 14 is a graphical user interface showing example setup time of proposed circuit (high to low). This particular figure shows a setup time for high to low transition of input D. The setup time is 19.47 pS with 38.94 pS clock to Q.

Figure 15:
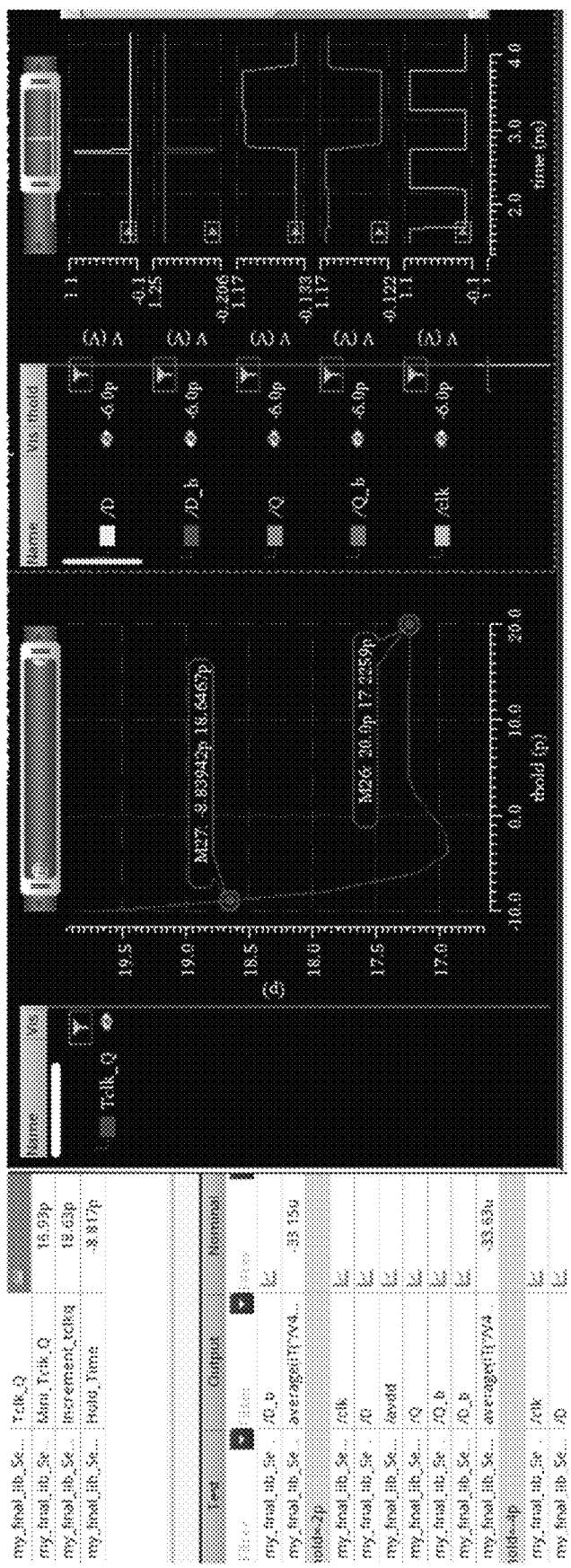
FIG. 15 is a graphical user interface showing example hold time of proposed circuit (low to high)

FIG. 15 is a graphical user interface showing example hold time of proposed circuit (low to high). This particular figure shows a change in clock to Q delay with thold time. The hold time for low to high transition of input is-8.817 pS with clock to Q delay 16.93 pS. The hold time is taken as time when clock to Q increased by 10% of constant clock to Q delay.

Figure 16:
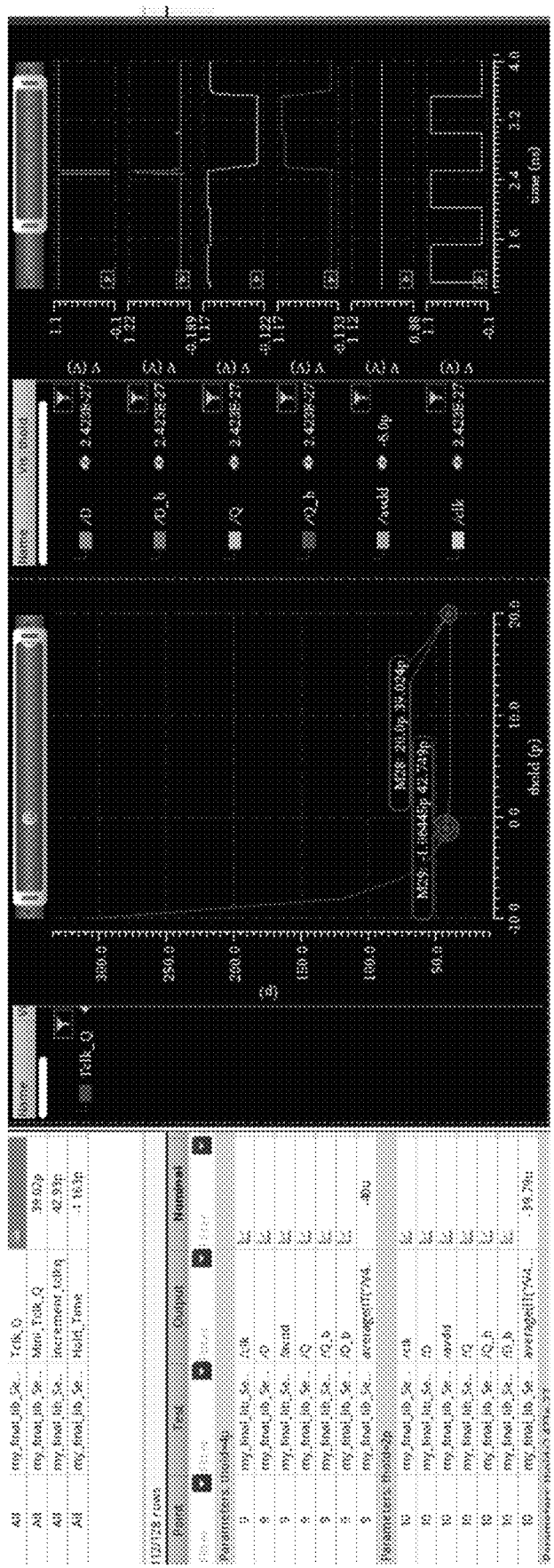
FIG. 16 is a graphical user interface showing example hold time of proposed circuit (high to low)

FIG. 16 is a graphical user interface showing example hold time of proposed circuit (high to low). This particular figure shows a change in clock to Q delay with thold time. The hold time for low to high transition of input is-1.163 pS with clock to Q delay 39.02 pS. The hold time is taken as time when clock to Q increased by 10% of constant clock to Q delay.

Figure 17:
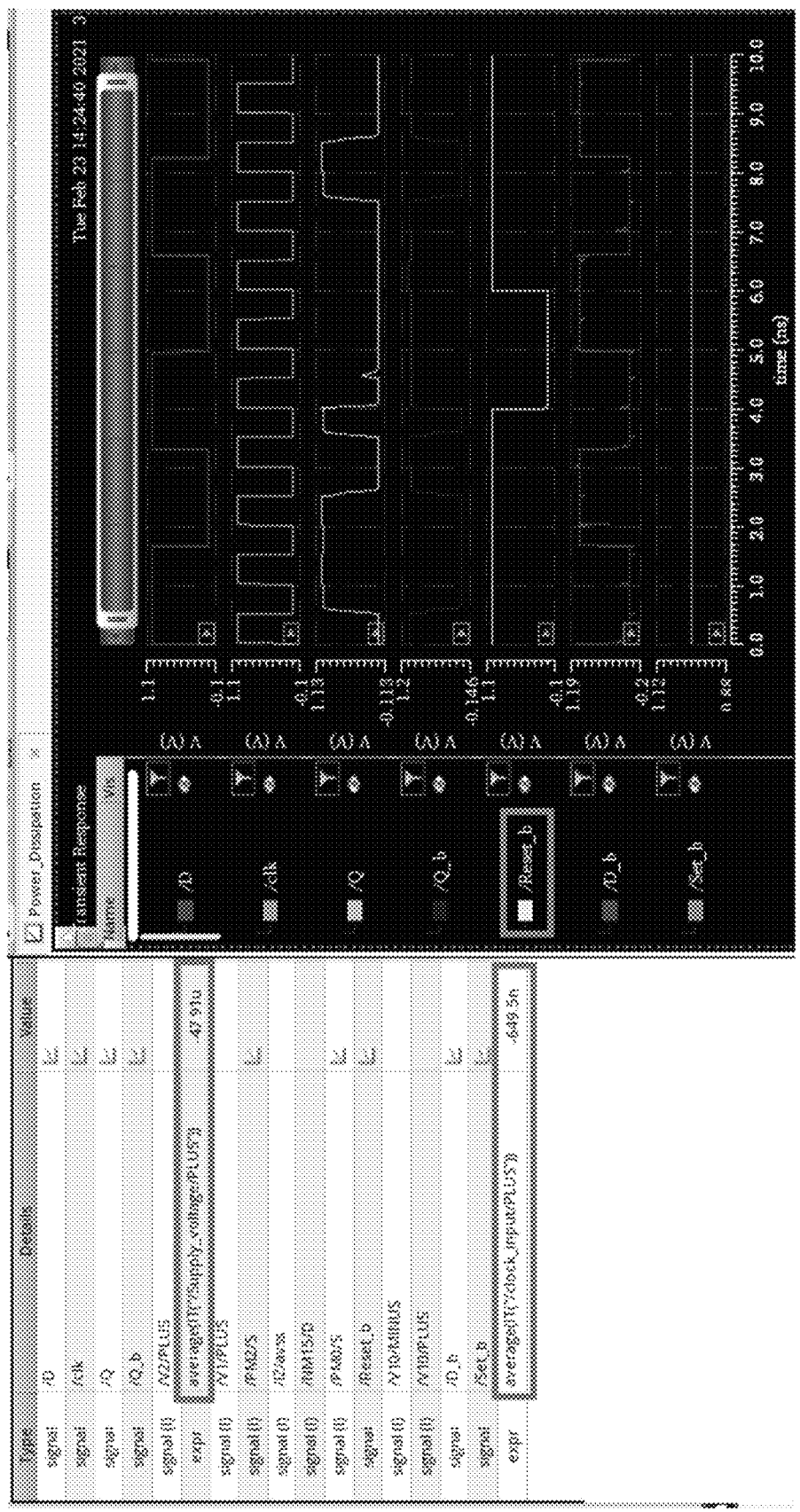
FIG. 17 is a graphical user interface showing example power dissipation results.

FIG. 17 is a graphical user interface showing example power dissipation results. Here, the power dissipation is measured and compared with existing systems. In this example the clock frequency is 1 GHz, Reset_b pin is enabled for 2 clock period, Set_b is disabled for complete time duration, and the simulation time is 10 nS. The figure shows the output waveform and corresponding power dissipation with clock loading power.

Figure 18:
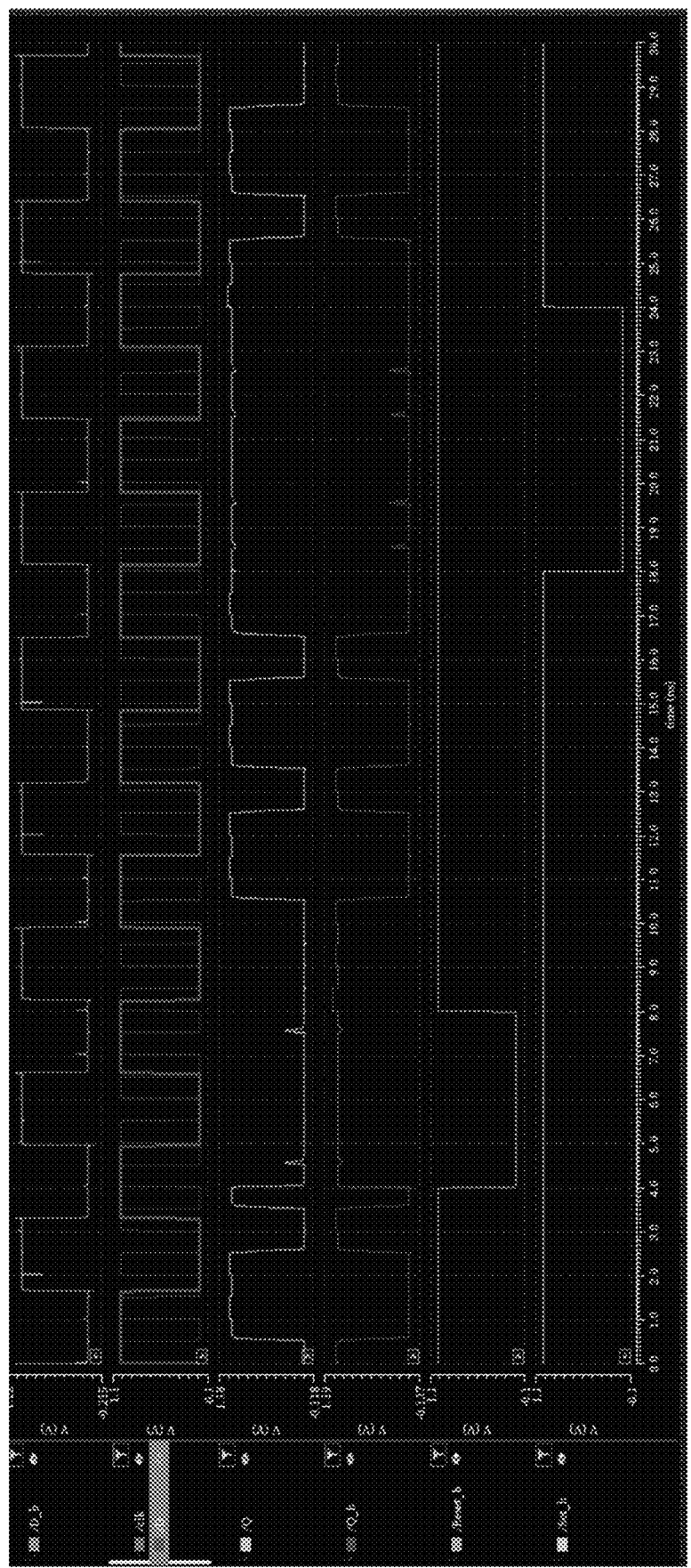
FIG. 18 is a graphical user interface showing an example output plot with set/reset pin.
Figure 20:
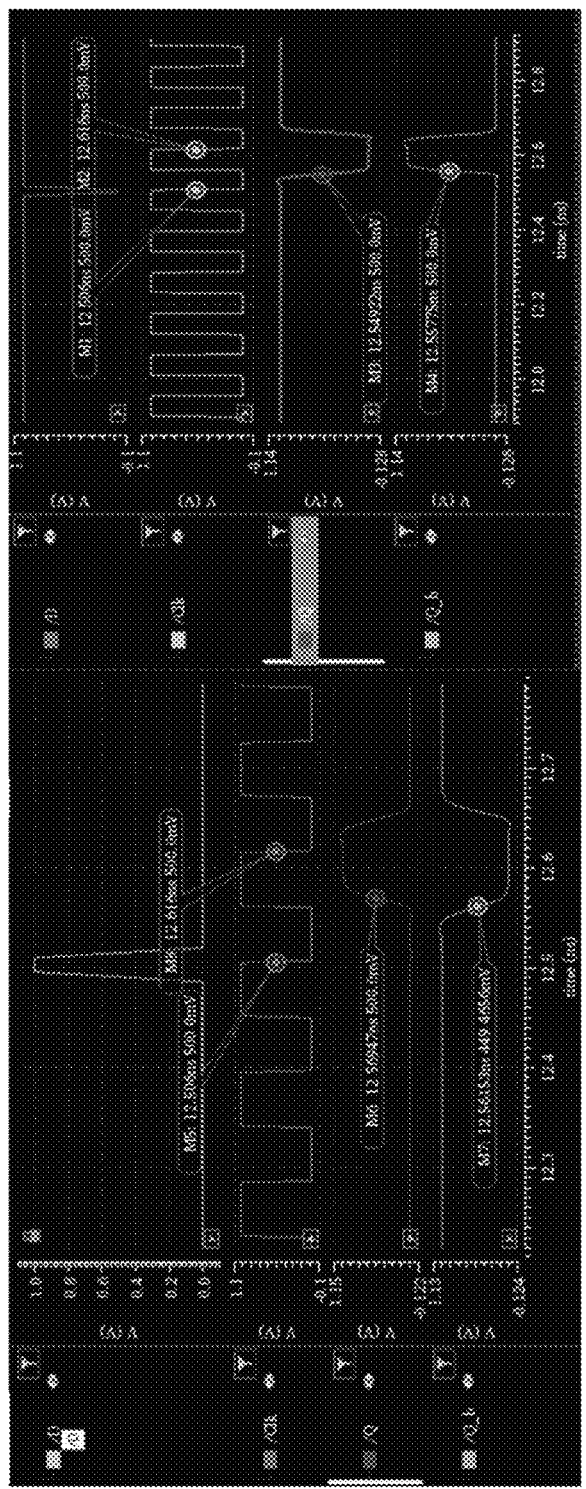
FIG. 20 is a graphical user interface showing an example with an operating frequency of 9 GHz.

FIG. 18 is a graphical user interface showing an example output plot with set/reset pin and FIG. 19 is a table showing a comparison between the proposed circuit of the present disclosure and existing technologies. FIG. 20 shows an example with an operating frequency of 9 GHz. As shown, the proposed flip-flop may operate above 9 GHz with a clock pulse width of 110 ps with good signal integrity. The clock to Q delay difference between high to low and low to high transition is very low.

As discussed herein, embodiments of the present disclosure provided numerous advantages over existing techniques. The circuits included herein are directed towards a high speed, single phase clock flip flop with a minimum number of MOS required. Extra routing of an inverted clock is not required. The clock is strongly coupled to the substrate via the parasitic capacitance of the clock distribution network, and the clock drivers. When the clock buffer charges or discharges its capacitive load, a large current peak may be produced in the power supply line that may result in undesirable simultaneous switching noise (SSN). In this way, the distribution of the clock generates a large quantity of the substrate noise that may result in a reduction in circuit behavior.

Embodiments included herein provide a circuit that may include differential inputs and in one particular implementation may a proposed flip-flop has a setup time (Low to High Transition of input)-22.82 pS and for High to low 19.47 pS and a Hold Time (Low to High Transition of input)--8.817 pS and for High to Low -1.16 pS. The circuit may include a worst case propagation delay-39.02 pS and a Power Dissipation-47 uW. In some embodiments, the circuit may include a maximum operating frequency of about 10 GHz at 40 nm technology.

In contrast with existing designs such as the TSPC, there is no charge sharing problem. It can work at lower frequencies as well where the TSPC fails due to charge sharing. Additionally and/or alternatively, the circuits described herein avoid any issues with race conditions as is common in static flip-flops. In some embodiments, NMOS and PMOS may be used at nodes to add a set and/or reset pin.

As discussed herein, the present disclosure is directed to a circuit that may include a cross-coupled PMOS connected with a cross-coupled NMOS via a pass gate. The circuit may further include a single-phase clock in communication with the cross-coupled PMOS and the cross-coupled NMOS. The circuit may also include a master and a slave each having an output node that charges and discharges to $V_{DD}$ or ground respectively, wherein there is no direct feedback from an output of the circuit to an input the circuit and there is no precharged state in the circuit (many existing techniques include a node that should remain charged before any operations are performed). The circuit may include an inverter connected to an output of the circuit that increases a driving strength of the circuit. The circuit may be semi-static and may include both static and dynamic properties. The circuit may include differential inputs. The circuit may include a single NMOS or PMOS at a node as a set pin and/or a single NMOS or PMOS at a node as a reset pin. The circuit may be included within an oscillator or a counter. The circuit may operate at a frequency range of up to 10 GHz. The pass gate may be a transmission gate, which provides the ability to operate with two phases of the clock if required. It may operate for a single phase of the clock as well as for a double phase of clock by just changing one pass gate with a transmission gate.

In some embodiments, differential outputs may be generated simultaneously. Most flip-flops only generate a single-ended output and an inverter is required to supply the complement. The extra inverter carries a speed penalty and places the two signals (Q and Q_b) out of alignment.

It will be apparent to those skilled in the art that various modifications and variations can be made in the current estimation scheme and debugging process of embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A circuit comprising:
   a master circuit consisting of a cross-coupled P-type metal-oxide-semiconductor "PMOS" and a first pass gate;
   a slave circuit consisting of a cross-coupled N-type metal-oxide-semiconductor "NMOS" and a second pass gate;
   a single-phase clock in communication with the cross-coupled PMOS and the cross-coupled NMOS; and
   wherein the master circuit and the slave circuit each include an output node that charges and discharges to $V_{DD}$ or ground respectively, wherein there is no direct feedback from an output of the circuit to an input the circuit and there is no precharged state in the circuit, wherein the output node of the master circuit is connected to an input node of the slave circuit.

2. The circuit of claim 1, wherein the circuit is semistatic and includes both static and dynamic properties.

3. The circuit of claim 1, wherein the circuit is included within a phase detector, oscillator, or a counter.

4. The circuit of claim 1, wherein the circuit operates at a frequency range of up to 10 GHz.

5. The circuit of claim 1, wherein the first pass gate is a transmission gate.

6. A method comprising:
   connecting a master circuit consisting of a cross-coupled P-type metal-oxide-semiconductor "PMOS" and a first pass gate with a slave circuit consisting of a cross-coupled N-type metal-oxide-semiconductor "NMOS" and a second pass gate;
   controlling the cross-coupled PMOS, the cross-coupled NMOS, and the pass gate using a single-phase clock; and
   charging and discharging, the master circuit and the slave, to $V_{DD}$ or ground respectively, wherein there is no direct feedback from an output of the circuit to an input of the circuit and there is no precharged state in the circuit, wherein an output node of the master circuit is connected to an input node of the slave circuit.

7. The method of claim 6, wherein the circuit is semistatic and includes both static and dynamic properties.

8. The method of claim 6, further comprising:
   providing the circuit within a phase detector, oscillator, or a counter.

9. The method of claim 6, further comprising:
   operating the circuit at a frequency range of up to 10 GHz.

10. The method of claim 6, wherein the first pass gate is a transmission gate.

* * * * *